United States Patent
Yu et al.

(10) Patent No.: US 9,293,218 B2
(45) Date of Patent: Mar. 22, 2016

(54) SEMICONDUCTOR MEMORY DEVICE HAVING OTP CELL ARRAY

(71) Applicant: Samsung Electronics Co., Ltd., Suwon-si (KR)

(72) Inventors: Je-Min Yu, Seoul (KR); Sung-Min Seo, Seoul (KR); Ho-Young Song, Hwaseong-si (KR); Gil-Su Kim, Hwaseong-si (KR); Jong-Min Oh, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 85 days.

(21) Appl. No.: 14/049,399

(22) Filed: Oct. 9, 2013

(65) Prior Publication Data
US 2014/0104921 A1   Apr. 17, 2014

(30) Foreign Application Priority Data

Oct. 11, 2012   (KR) .................... 10-2012-0113033

(51) Int. Cl.
| | |
|---|---|
| G11C 16/04 | (2006.01) |
| G11C 17/08 | (2006.01) |
| G11C 17/16 | (2006.01) |
| G11C 17/18 | (2006.01) |
| G11C 29/00 | (2006.01) |

(52) U.S. Cl.
CPC ................ *G11C 17/08* (2013.01); *G11C 17/16* (2013.01); *G11C 17/18* (2013.01); *G11C 29/785* (2013.01); *G11C 16/04* (2013.01); *G11C 16/0483* (2013.01)

(58) Field of Classification Search
CPC ..... G11C 29/82; G11C 16/04; G11C 16/0483
USPC ............................... 365/185.09, 185.2, 210.1
See application file for complete search history.

(56) References Cited

U.S. PATENT DOCUMENTS

| | | | |
|---|---|---|---|
| 7,511,982 | B2 | 3/2009 | Kurjanowicz et al. |
| 7,852,656 | B2 | 12/2010 | Shin et al. |
| 2005/0248998 | A1* | 11/2005 | Jung ............................ 365/200 |
| 2007/0217247 | A1 | 9/2007 | Chen et al. |
| 2009/0251943 | A1 | 10/2009 | Kurjanowicz |
| 2011/0103127 | A1 | 5/2011 | Kurjanowicz |

FOREIGN PATENT DOCUMENTS

KR   10-0747281 B1   8/2007

\* cited by examiner

*Primary Examiner* — Jason Lappas
(74) *Attorney, Agent, or Firm* — Muir Patent Law, PLLC

(57) ABSTRACT

Provided is a semiconductor memory device. The semiconductor includes a One Time Programmable (OTP) cell array, a converging circuit and a sense amplifier circuit. The OTP cell array includes a plurality of OTP cells connected to a plurality of bit lines, each bit line extending in a first direction. The converging includes a common node contacting a first bit line and a second bit line. The sense amplifier circuit includes a sense amplifier connected to the common node, the sense amplifier configured to amplify a signal of the common node.

6 Claims, 16 Drawing Sheets

SEMICONDUCTOR MEMORY DEVICE HAVING OTP CELL ARRAY

CROSS-REFERENCE TO RELATED APPLICATIONS

This application claims priority under 35 U.S.C. §119(a) to Korean Patent Application No. 10-2012-0113033, filed on Oct. 11, 2012, in the Korean Intellectual Property Office, the disclosure of which is incorporated herein in its entirety by reference.

BACKGROUND

This disclosure relates to a semiconductor memory device having a One Time Programmable (OTP) cell array, and more particularly, to a semiconductor memory device having an improved arrangement structure of a sense amplifier circuit for sensing and amplifying a signal of a bit line connected to an OTP cell.

In general, the sense amplifier circuit for an OTP cell array includes a plurality of sense amplifiers and thus an area of the sense amplifier circuit should be considered.

Among data storing devices, a device retaining data even when no power is supplied is referred to as nonvolatile memory. For example, nonvolatile memory includes Read Only Memory (ROM), a magnetic disk, an optical disk, and flash memory. Especially, among nonvolatile memories, the kind of memory in which if data is written once and cannot be changed, is referred to as OTP memory. Once data is programmed in the OTP memory, a structure of an OTP cell, a storage unit of data that the OTP memory stores, becomes irreversible, and by using this characteristic, '0' or '1' may be stored.

SUMMARY

The disclosed embodiments relate to a semiconductor memory device having a One Time Programmable (OTP) cell array, and provides a semiconductor memory device having an improved arrangement structure of a sense amplifier for sensing and amplifying a signal of a bit line that transmits bit data.

According to one embodiment, there is provided a semiconductor memory device includes a one Time Programmable (OTP) cell array, a converging circuit and a sense amplifier circuit. The OTP cell array includes a plurality of OTP cells connected to a plurality of bit lines. Each of the bit lines extends in a first direction. The converging circuit includes a common node contacting a first bit line and a second bit line. The sense amplifier circuit includes a sense amplifier connected to the common node and the sense amplifier is configured to amplify a signal of the common node.

According to one embodiment, there is provided a semiconductor memory device including a first OTP cell array and a second OTP cell array, a converging circuit, and a sense amplifier circuit. Each of the first and second OTP cell arrays includes a plurality of bit lines connected to a plurality of OTP cells. Each of the bit lines extends in a first direction. The converging circuit connects to at least a first bit line of the first OTP cell array and at least a first bit line of the second OTP cell array. The sense amplifier circuit is configured to amplify at least one signal of the selected bit line.

According to one embodiment, there is provided a semiconductor memory device including first and second OTP cell arrays, first and second column selectors, a converging circuit, and a sense amplifier circuit. Each of the first and second OTP cell arrays includes a plurality of OTP cells connected to word lines and bit lines. The first column selector is configured to select at least a first bit line of the first OTP cell array in response to a column address. The second column selector is configured to select at least a second bit line of the second OTP cell array in response to the column address. The converging circuit is configured to select at least one bit line between the first bit line and second bit line. The sense amplifier circuit is configured to amplify at least one signal of the selected bit line.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
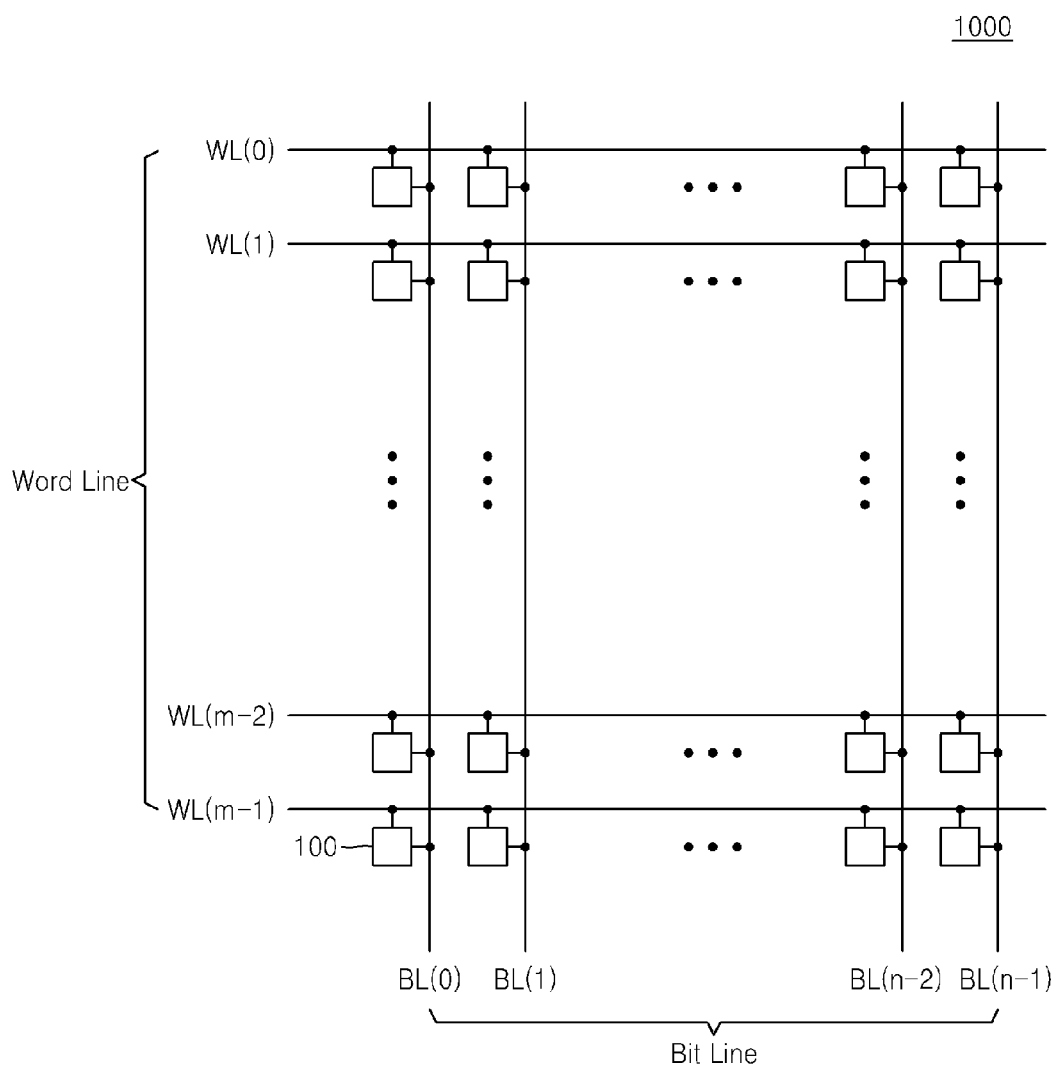
FIG. 1 is a view illustrating an OTP cell array including a plurality of antifuse cells.

Hereinafter, exemplary embodiments will be described in more detail with reference to the accompanying drawings, in which embodiments of the disclosure are shown.

This disclosure may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

A One Time Programmable OTP memory is used for repairing a semiconductor device. For example, malfunctions of a semiconductor device may be prevented by storing its characteristics in an OTP memory according to a test result after testing, and operating the semiconductor device based on the information stored in the OTP memory.

An antifuse, as one example of components that a cell of the OTP memory includes, has electrical characteristics opposite to those of a fuse, and is a resistive fuse device having a high resistance value in an un-programmed state and a low resistance value in a programmed state. The antifuse is generally configured with a dielectric between conductors and is programmed by applying a high voltage through the conductors at both ends of the antifuse for a sufficient period of time to destroy the dielectric therebetween. As a result of the programming, the conductors at the both ends of the antifuse are short circuited, so that they may have a low resistance value.

The antifuse may store information for a relative simple repair after a package process of a semiconductor device. For example, since a memory cell array for storing data also stores and uses information on defective cells in an OTP memory built in a semiconductor memory device, the semiconductor memory device may normally operate despite of the presence of the defective cells. It will be assumed hereinafter that the OTP memory includes antifuse cells.

FIG. 1 is a view illustrating an OTP cell array 1000 including a plurality of antifuse cells. The OTP cell array 1000 includes a plurality of antifuse cells 100 connected to word lines WL(0) to WL(m−1) and bit lines BL(0) to BL(n−1). One of the word lines WL(0) to WL(m−1) may be activated according to an address input from the outside, with respect to data stored in the OTP cell array 1000. The antifuse cell 100 connected to the activated word line may output a signal corresponding to the stored bit data to each of the bit lines BL(0) to BL(n−1). Hereinafter, it will be assumed that an OTP cell array, including an antifuse cell, includes m word lines and n bit lines and m×n antifuse cells, where m and n are positive integers. Additionally, although not shown in FIG. 1, the OTP cell array 1000 may further include a signal line for programming the antifuse cell 100, and each antifuse cell 100 may be connected to the signal line.

As shown in FIG. 1, the plurality of antifuse cells 100 arranged in a column direction may be connected to different word lines and may share one bit line. On the contrary, the plurality of antifuse cells 100 arranged in a row direction may be connected to different bit lines and may share one word line. Since one of the plurality of word lines WL(0) to WL(m−1) is activated according to an address and the remaining m−1 word lines are in a deactivated state, signal collision may not occur in a bit line by at least two antifuse cells 100 among a plurality of antifuse cells connected to one bit line.

Moreover, in relation to a memory including the OTP cell array 1000, the number of bits in data accessed by an address may be less than the number of bit lines in the OTP cell array 1000. For example, as shown in FIG. 1, the OTP cell array 1000 may include a total of n bit lines but the data accessed by an address may be n/2, n/4 or n/8. Accordingly, some of the plurality of bit lines in the OTP cell array 1000 may be selected by an address, as described later.

Figure 2:
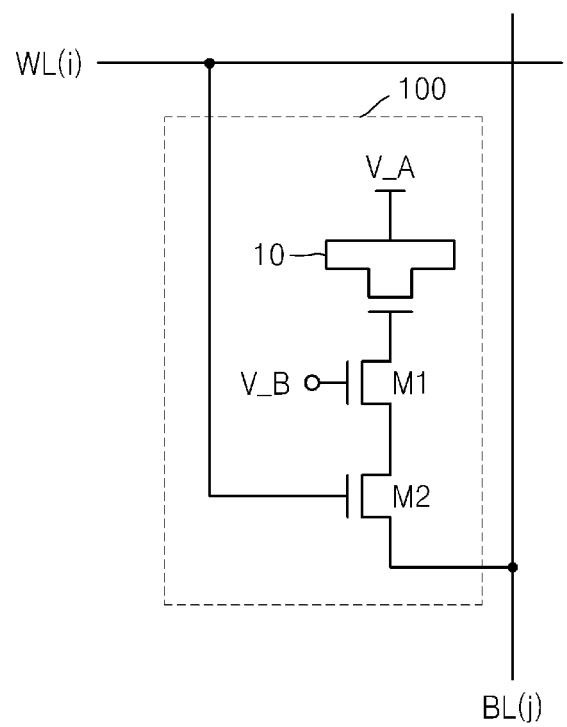
FIG. 2 is a view illustrating an antifuse cell in the OTP cell array of FIG. 1, according to an exemplary embodiment.

FIG. 2 is a view illustrating an antifuse cell 100 in the OTP cell array 1000 of FIG. 1, according to an exemplary embodiment. The antifuse cell 100 may be connected to one word line WL(i) and one bit line BL(j). As shown in FIG. 2, the antifuse cell 100 may include an antifuse circuit 10 and two transistors M1 and M2. The antifuse circuit 10 may have a resistance difference at both ends of the antifuse circuit 10 depending on whether it is programmed.

A voltage V_A applied to one end of the antifuse circuit 10 may vary according to an operation mode of the antifuse cell 100. For example, when bit data is programmed into the antifuse cell 100, the voltage V_A may be sufficiently high to destroy a gate oxide layer of the antifuse circuit 10. Moreover, when bit data stored in the antifuse cell 100 is outputted to the bit line BL(j), the voltage V_A may become a power voltage of the OTP cell array 1000 in order to apply a predetermined voltage to the both ends of the antifuse circuit 10. The detailed structure of the antifuse circuit 10 will be described later.

The transistor M1 may serve to protect the remaining circuits from a high voltage when a voltage on a node V_A becomes high according to a programming operation of the antifuse cell 100. For this, a gate voltage of the transistor M1 may be always maintained with a predetermined voltage V_B, and the transistor M1 may be a high voltage MOS transistor that endures a high voltage.

The transistor M2 may control whether to output a signal corresponding to bit data stored in the antifuse cell 100 to the bit line BL (j). That is, a gate of the transistor M2 is connected to the word line WL(i), and when the word line WL(i) is activated, a charge path may be formed between a source and a drain of the transistor M2. When the word line WL(i) is activated according to an address, a current path leading to the bit line BL (j), may be formed, wherein the current path sequentially passes through from the node V_A to the antifuse circuit 10, the transistor M1, and the transistor M2.

When the voltage of the bit line BL(j) is uniformly maintained, a predetermined voltage is applied between the node V_A and the bit line BL(j), and accordingly, the amount of current flowing from the node V_A node to the bit line BL(j) may be determined according to a resistance value between the node V_A and the bit line BL(j). If the gate oxide layer of the antifuse circuit 10 is destroyed according to a programming operation and thus a resistance value at the both ends of the antifuse circuit 10 is low, a current flowing into the bit line BL(j) may be relatively high. On the contrary, if the gate oxide layer of the antifuse circuit 10 is maintained and thus a resistance value at both ends of the antifuse circuit 10 is high, a current flowing into the bit line BL(j) may be relatively low. Accordingly, if a difference between currents flowing into the bit line BL(j) is detected, bit data that the antifuse cell 100 stores may be determined.

The embodiment of the antifuse cell 100 shown in FIG. 2 is exemplary, and it is apparent that embodiments of the present invention are applicable to an antifuse cell 100 including the antifuse circuit 10 and having a different structure from the antifuse cell 100 of FIG. 2.

Figure 3:
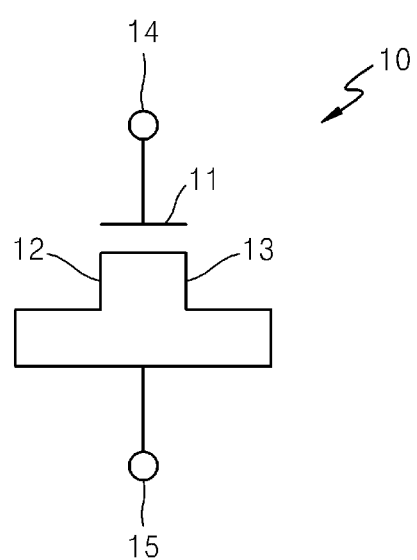
FIG. 3 is a structural view of an antifuse circuit in the antifuse cell of FIG. 2.

FIG. 3 is a structural view of an antifuse circuit 10 in the antifuse cell 100 of FIG. 2. The antifuse circuit 10 includes a depletion type MOS transistor having a source 12 and a drain 13. In an initial state, a resistance between a first node 14 connected to a gate electrode 11 and a second node 15 commonly connected to the source 12 and the drain 13 is very high because they are separated by a gate oxide layer. Accordingly, a non-conductive state is provided between the first node 14 and the second node 15. The antifuse circuit 10 destroys the gate oxide layer by applying a breakdown voltage between the first node 14 and the second node 15, in order to change from a non-conductive state into a conductive state, i.e., an irreversible state. Once the gate oxide layer is destroyed, a resistance between the first node 14 and the second node 15 decreases.

Figure 4A:
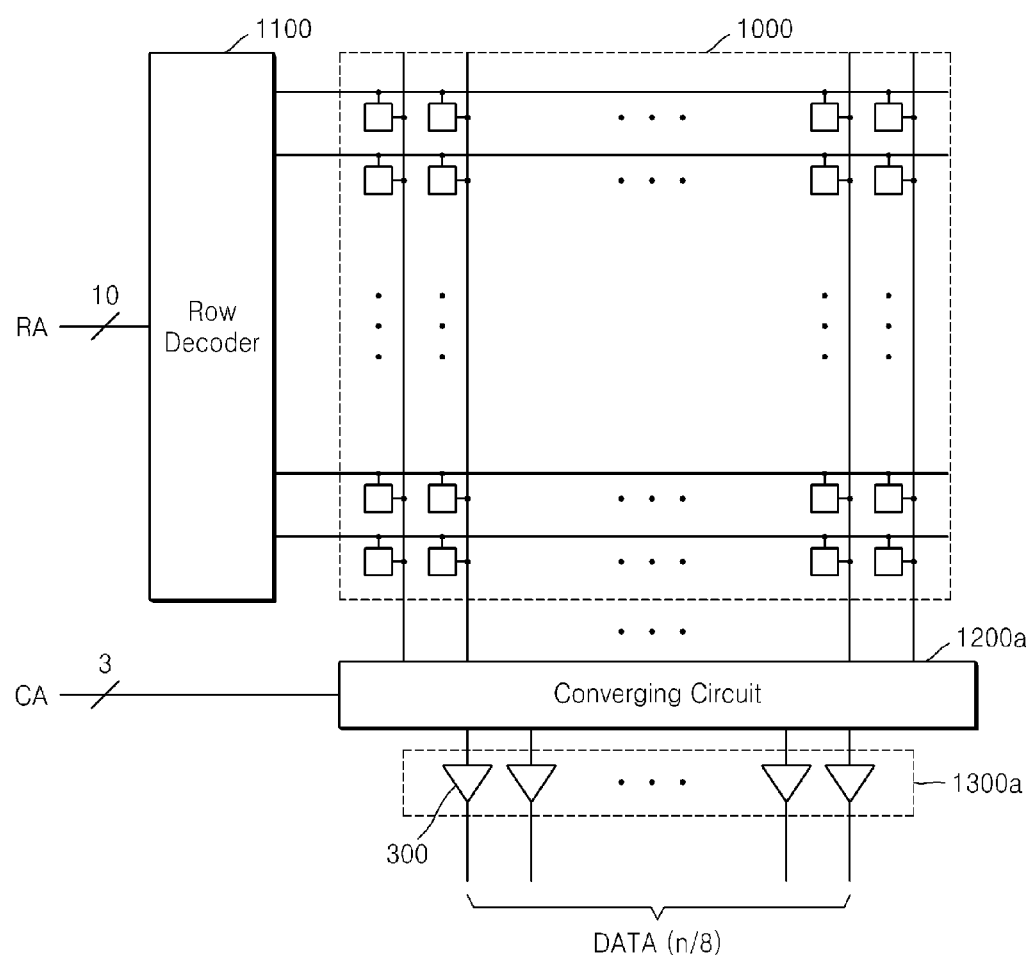
FIGS. 4A and 4B are views illustrating an OTP memory according to exemplary embodiments.
Figure 4B:
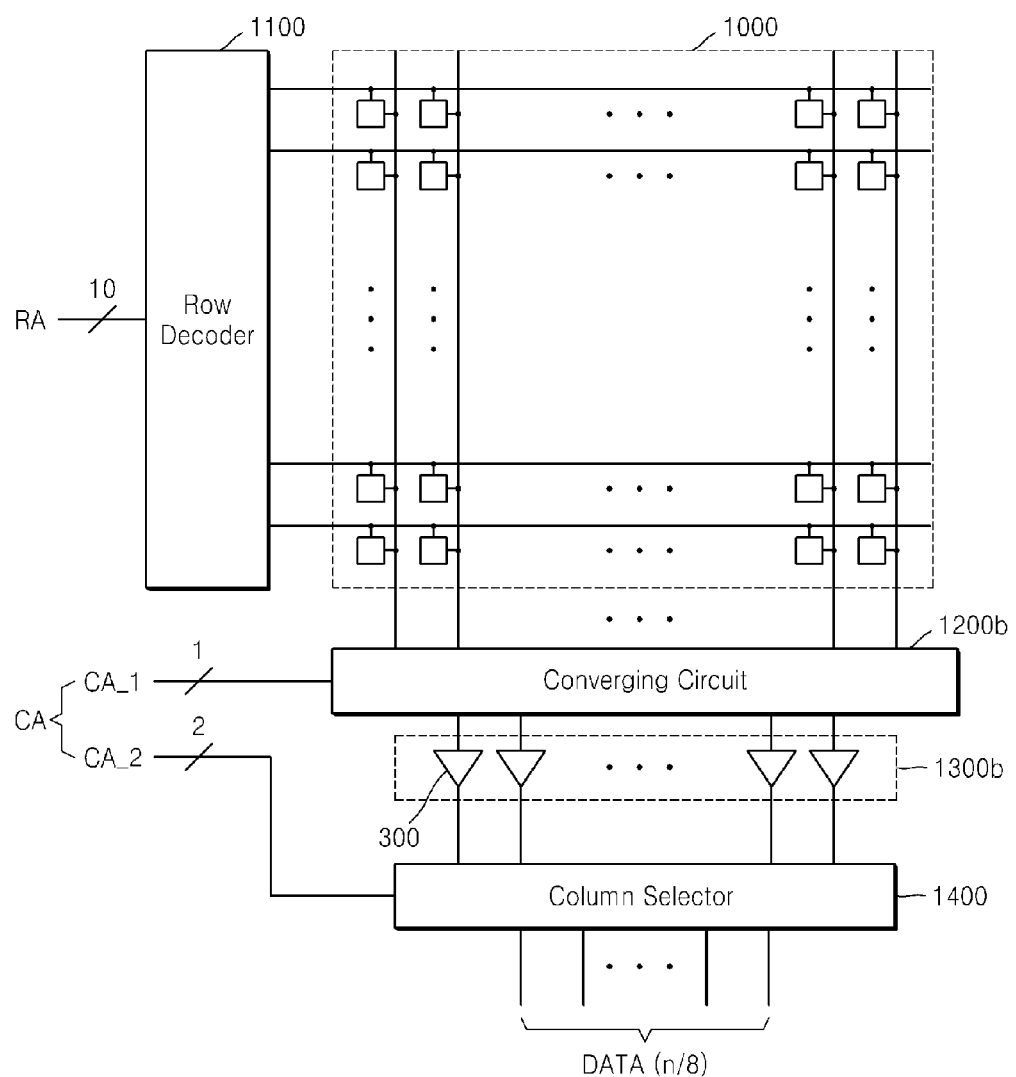

FIGS. 4A and 4B are views illustrating an OTP memory according to exemplary embodiments. The OTP memory stores bit data in an antifuse cell and outputs the bit data to the outside according to an address. For these operations, the OTP memory may include other components in addition to the OTP cell array 1000 of FIG. 1. As mentioned above, according to the embodiments shown in FIGS. 4A and 4B, the OTP cell array 1000 may include m word lines and n bit lines. Additionally, in the embodiments of FIGS. 4A and 4B, the address of the OTP memory includes a total of 13 bits. The 13-bit address includes a 10-bit row address and a 3-bit column address. Additionally, according to embodiments, data outputted from the OTP memory may include n/8 bits.

In addition, when an OTP cell is programmed, the same bit data may be stored in at least two OTP cells in order to obtain bit data accuracy. At this point, OTP cells storing bit data may be disposed to be connected to the same word line. Accordingly, when data is written on the OTP memory, the same bit data may be simultaneously programmed into at least two OTP cells connected to one word line, and as a result, a data programming time may be reduced. According to the embodiments shown in FIGS. 4A and 4B, since data accessed by an address in n bit lines includes n/8 bits, the same bit data may be simultaneously programmed on 8 OTP cells.

FIG. 4A is a view illustrating an OTP memory according to an exemplary embodiment. According to an embodiment, the OTP memory may include the OTP cell array 1000, a row decoder 1100, a converging circuit 1200a, and a sense amplifier circuit 1300a. As described with reference to FIG. 1, the OTP cell array 1000 may output a signal corresponding to bit data stored in an antifuse cell to a bit line when a word line is activated. The row decoder 1100 receives a row address RA among addresses received from the outside and decodes the received row address RA, and accordingly, activates one of a plurality of word lines. That is, one word line may be activated for each row address RA. For example, as shown in FIG. 4A, if the number of bits of the row address RA is 10, the m number of word lines is $2^{10}$.

The OTP cell array 1000 may transmit a signal to the converging circuit 1200a through a bit line. The converging circuit 1200a may select some of the bit lines of the OTP cell array 1000 according to a column address CA, and may output a signal of the selected bit line. For example, as shown in FIG. 4A, if the number of bits of the column address CA is 3, since the number of bit lines of the OTP cell array 1000 is n, the converging circuit 1200a may select n/8 bit lines from the n bit lines, and may output n/8 bit line signals. Accordingly, the OTP memory may output n/8 bit data DATA with respect to one address to the outside.

The sense amplifier circuit 1300a may include a plurality of sense amplifiers 300. The sense amplifier 300 detects a current flowing (or, a voltage) in a bit line and amplifies the detected current (or, the voltage). The sense amplifier circuit 1300a connects a sense amplifier 300 to each bit line that the converging circuit 1200a selects so as to detect and amplify a current flowing in each bit line. As shown in FIG. 4A, the sense amplifier circuit 1300a may be connected to the converging circuit 1200a through n/8 bit lines, and accordingly, n/8 sense amplifiers 300 may be provided. In this embodiment, the sense amplifier 300 may detect and amplify a current flowing in a bit line according to the structure of the antifuse cell 100 of FIG. 2, but according to a structure of an antifuse cell, the sense amplifier 300 may detect and amplify a voltage of a bit line.

Unlike the embodiment of FIG. 4A, if the converging circuit 1200a is omitted and a sense amplifier is connected to each bit line of the OTP cell array 1000, a sense amplifier circuit may include n sense amplifiers. On the contrary, according to the embodiment shown in FIG. 4A, the sense amplifier circuit 1300a may include n/8 sense amplifiers 300. Accordingly, due to the converging circuit 1200a, the number of sense amplifiers 300 may be reduced, and accordingly, an area that the sense amplifier circuit 1300a occupies may be reduced.

FIG. 4B is a view illustrating an OTP memory according to another exemplary embodiment. The OTP memory may include the OTP cell array 1000, the row decoder 1100, a converging circuit 1200b, a sense amplifier circuit 1300b, and a column selector 1400. The OTP cell array 1000 and the row decoder 1100 may perform the functions similar to those of FIG. 4A.

In one embodiment, the column address CA may include a 1-bit first column address CA_1 and a 2-bit second column address CA_2. The converging circuit 1200b may receive the first column address CA_1. Since the first column address CA_1 is configured with 1 bit, the converging circuit 1200b may select n/2 bit lines among the n bit lines of the OTP cell array 1000 according to the first column address CA_1, and may output the signals of the selected n/2 bit lines.

The sense amplifier circuit 1300b may include n/2 sense amplifiers 300 and may detect and amplify signals of the n/2 bit lines outputted from the converging circuit 1200b. The column selector 1400 may receive the second column address CA_2 and may select the n/8 signal lines among the n/2 signal lines outputted from the sense amplifier circuit 1300b according to the second column address CA_2, and then, may output signals of the selected n/8 signal lines.

As shown in FIGS. 4A and 4B, the OTP memory further includes the column selector 1400 due to adjusting the number of bits of the column address CA or the first column address CA_1 that the converging circuit 1200a or 1200b receives. When the size of the OTP cell array 1000 is increased, the number of antifuse cells arranged in a column direction and connected to one bit line may be increased. As the number of antifuse cells connected to a bit line is increased, the length of a bit line may be increased, and accordingly, the resistance value and amount of leakage current of a bit line may be increased. As a result, an amount of current outputted to the outside of the OTP cell array 100 through a bit line may be reduced in correspondence to bit data stored in an antifuse cell, and it may become more difficult to recognize the bit data stored in an antifuse cell by detecting an amount of current.

Additionally, as the number of bits of the first column address CA_1 that the converging circuit 1200b receives is increased, the number of bit lines selected by the converging circuit 1200b may be increased. As the number of selected bit lines is increased, a structure of the converging circuit 1200b for selecting a bit line may become further complicated, and accordingly, the sense amplifier circuit 1300b may be difficult to detect a bit line signal that the converging circuit 1200 outputs. Accordingly, according to the characteristics of a bit line of the OTP cell array 1000, the number of bit lines selected by the converging circuit 1200b may be limited, and the number of bits of the first column address CA_1 may be determined. As the number of bits of the first column address CA_1 is determined, the column selector 1400 may select and output data of the OTP memory according to the second column address CA_2 among the signals outputted from the sense amplifier circuit 1300b

Figure 5:
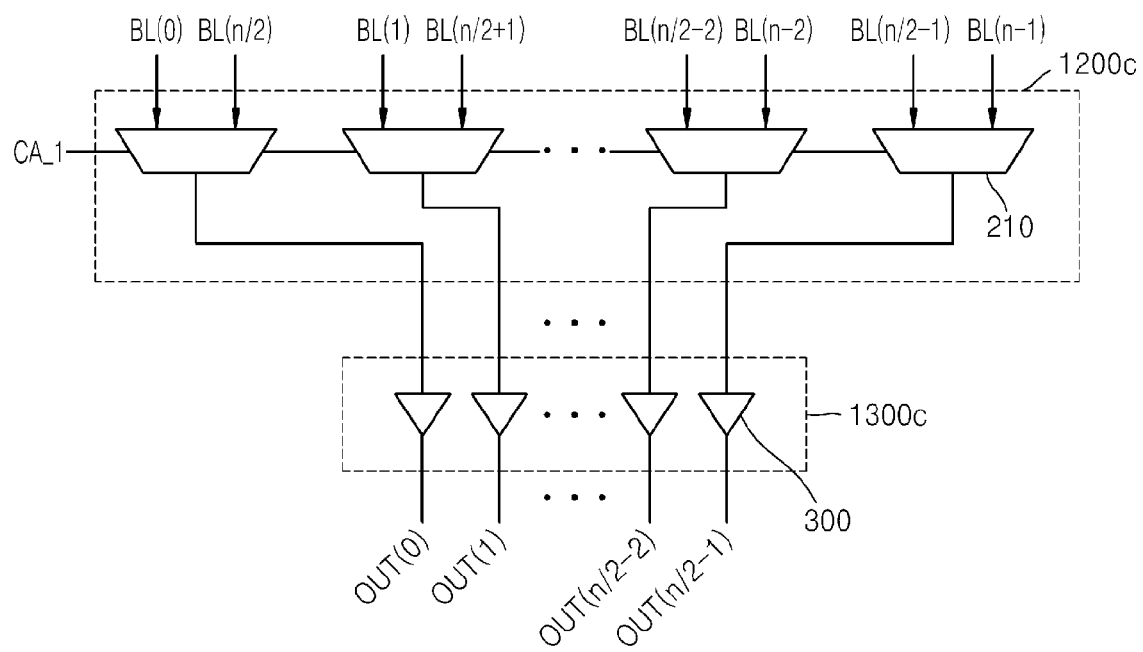
FIG. 5 is a view illustrating a converging circuit and a sense amplifier circuit, according to an exemplary embodiment.

FIG. 5 is a view illustrating a converging circuit 1200c and a sense amplifier circuit 1300c, according to an exemplary embodiment. In one embodiment, the number of bits of the first column address CA_1 is 1. As shown in FIG. 5, the converging circuit 1200c may include a plurality of multiplexers 210. A multiplexer 210 may receive a select signal and select at least one of a plurality of input signals according to the received select signal. For example, the multiplexer 210 receives the first column address CA_1 as a select signal and uses a plurality of bit lines of an OTP cell array as an input.

As shown in FIG. 5, the multiplexer 210 may receive two bit lines of the OTP cell array, and may select one of the two bit lines according to the 1-bit first column address CA_1. Since the number of bit lines connected to the OTP cell array is n, the converging circuit 1200c may include n/2 multiplexers 210, and may output selected bit line signals to the n/2 signal lines. The sense amplifier circuit 1300c may receive the selected bit line signals through the n/2 signal lines from the converging circuit 1200c. The sense amplifier circuit 1300c may include n/2 sense amplifiers 300 and may detect and amplify bit line signals transmitted through the n/2 signal lines.

Although FIG. 5 illustrates the embodiment in which the first column address CA_1 has 1 bit, if the e first column address CA_1 has at least 2 bits, each multiplexer 210 receives an input through at least four bit lines and outputs a signal of one bit line.

Figure 6A:
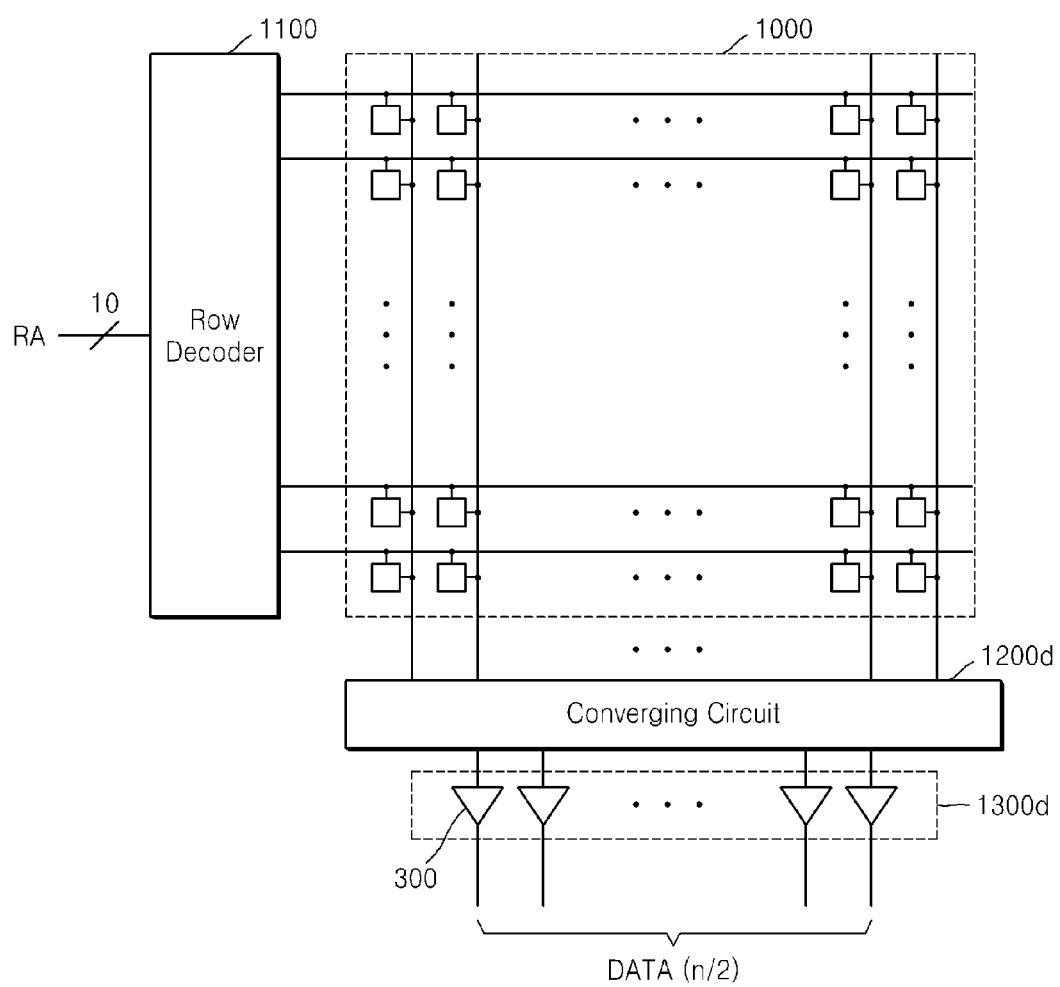
FIG. 6A is a view illustrating an OTP memory according to another exemplary embodiment.

FIG. 6A is a view illustrating an OTP memory according to another exemplary embodiment. The OTP memory may include the OTP cell array 1000, the row decoder 1100, a converging circuit 1200d, and a sense amplifier circuit 1300d. Since the OTP cell array 1000 and the row decoder 1100 are described with reference to FIG. 1, their detailed descriptions are omitted.

In one embodiment, the same data may be stored in at least two OTP cells of the OTP cell array 1000. For example, in order to prevent the loss of data due to defective OTP cells due to manufacturing processes or usage environments, the same data may be stored in at least two OTP cells. At least two OTP cells storing the same data may simultaneously output data to two bit lines connected to each OTP cell. An OTP cell that redundantly stores data as described above is referred to as a voting cell.

The converging circuit 1200d may output signals to the sense amplifier circuit 1300d through some of the bit lines of the OTP cell array 1000. For example, the converging circuit 1200d may include a common node that electrically connects at least two bit lines and may output a signal of the common node to the sense amplifier circuit 1300d. In one embodiment, OTP cells connected to each of at least two bit lines connected to a common node may store the same data. For example, voting cells storing the same data are connected to the same word line, and their bit lines may be connected to the same node (e.g., the common node). The converging circuit 1200d may output bit data that the voting cells store to the sense amplifier circuit 1300d.

Moreover, data may be simultaneously written on voting cells. For example, since the converging circuit 1200d includes a node (e.g., a common node) to which the bit lines of voting cells for the same data are electrically connected, the same data is simultaneously written on voting cells by applying data to be written to the node.

Figure 6B:
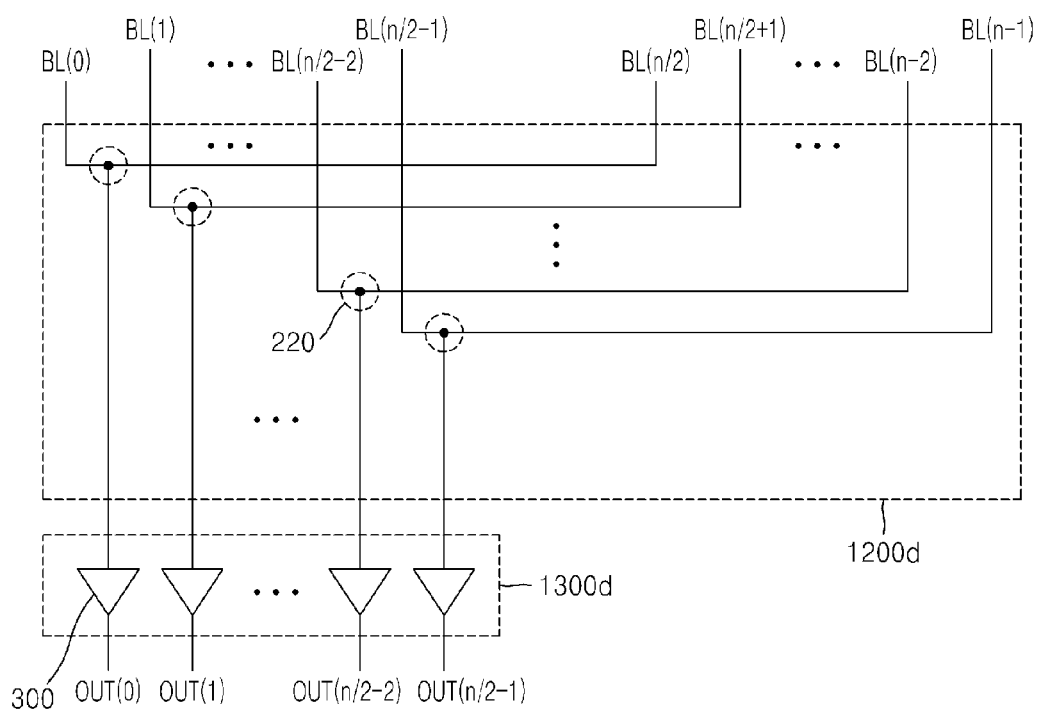
FIG. 6B is a view illustrating the converging circuit of FIG. 6A according to an exemplary embodiment.

FIG. 6B is a view illustrating the converging circuit 1200d of FIG. 6A according to an exemplary embodiment. As shown in FIG. 6A, the converging circuit 1200d may transmit signals of the bit lines BL(0) to BL(n−1) of the OTP cell array 10000 to the sense amplifier circuit 1300d. As shown in FIG. 6B, the converging circuit 1200d may include a combination node (e.g., a common node) that connects each of the bit lines BL(0) to BL(n/2−1) or the bit lines BL(n/2) to BL(n−1). The bit line BL(0) may be connected to the bit line BL(n/2), and the bit line (n/2−1) may be connected to the bit line BL(n−1) by each combination node. As mentioned above, if k is an integer between 0 and n/2−1, the bit lines BL(k) and BL(k+n/2) may output bit data that OTP cells (i.e. voting cells) used for storing the same bit data store. Accordingly, the converging circuit 1200d may include the combination node 220 instead of a multiplexer.

Figure 7:
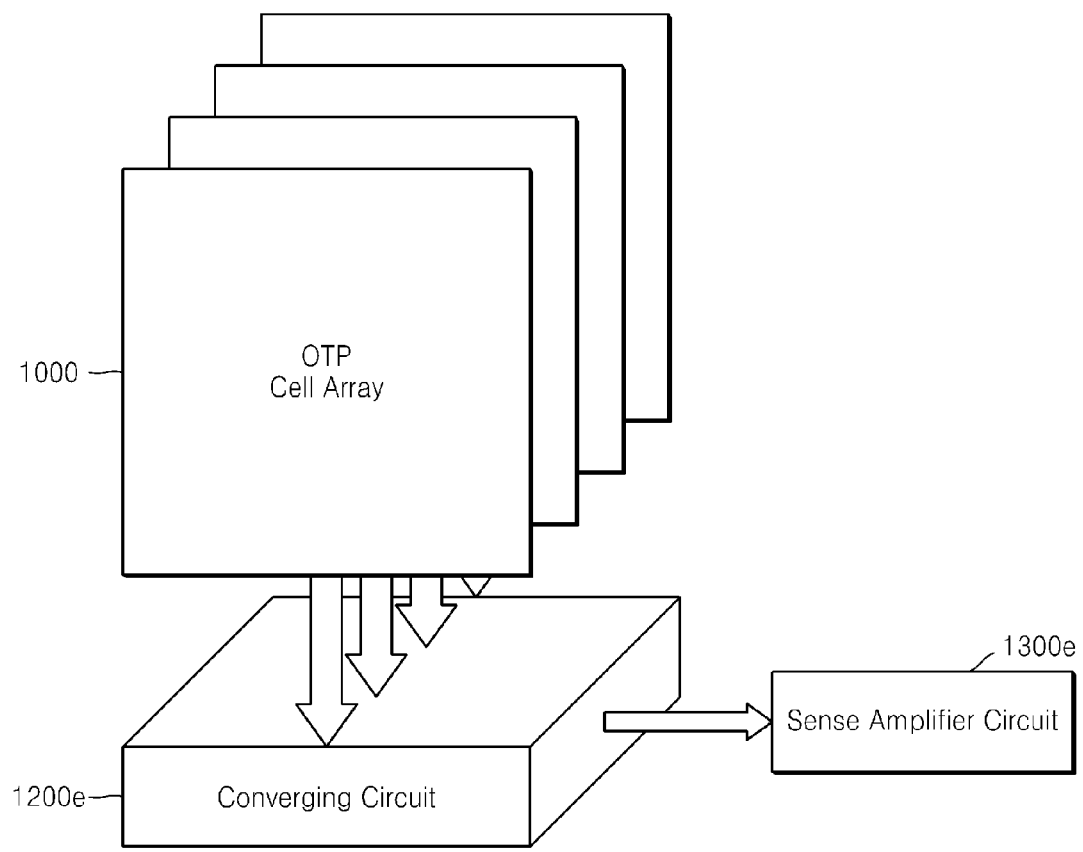
FIG. 7 is a view illustrating an OTP memory including a plurality of OTP cell arrays, according to an exemplary embodiment.

FIG. 7 is a view illustrating an OTP memory including a plurality of OTP cell arrays 1000, according to an exemplary embodiment. The OTP memory may include a plurality of OTP cell arrays 1000 each including antifuse cells, word lines, and bit lines. As shown in FIG. 7, the OTP memory may include a converging circuit 1200e and a sense amplifier circuit 1300e. As an area of one OTP cell array 1000 in the OTP memory is increased, the lengths of the word lines and the bit lines in the OTP cell array 1000 may also be increased.

As mentioned above, if the lengths of the word lines and the bit lines are increased, their resistance values and leakage currents may be increased. When each of the word lines is long, a speed at which an antifuse cell outputs a signal corresponding to the stored bit data to a bit line in response to an activated word line is deteriorated, so that each antifuse cell may have different response times to the activated word line. Additionally, when each of the bit lines is long, as mentioned above, a current output to a bit line may be reduced to make it difficult to detect the current. However, as shown in FIG. 7, in order to overcome such limitations, the OTP memory may include the plurality of OTP cell arrays 1000, rather than increasing the area of one OTP cell array 1000.

As shown in FIG. 7, the converging circuit 1200e may receive a signal from the plurality of OTP cell arrays 1000 through a bit line. The converging circuit 1200e may transmit a signal of at least one bit line among the bit lines of the OTP cell array 1000 to the sense amplifier circuit 1300*e*. Operations of the converging circuit 1200*e* and the sense amplifier circuit 1300*e* in the OTP memory including the plurality of OTP cell arrays 1000 will be described in more detail below.

Figure 8A:
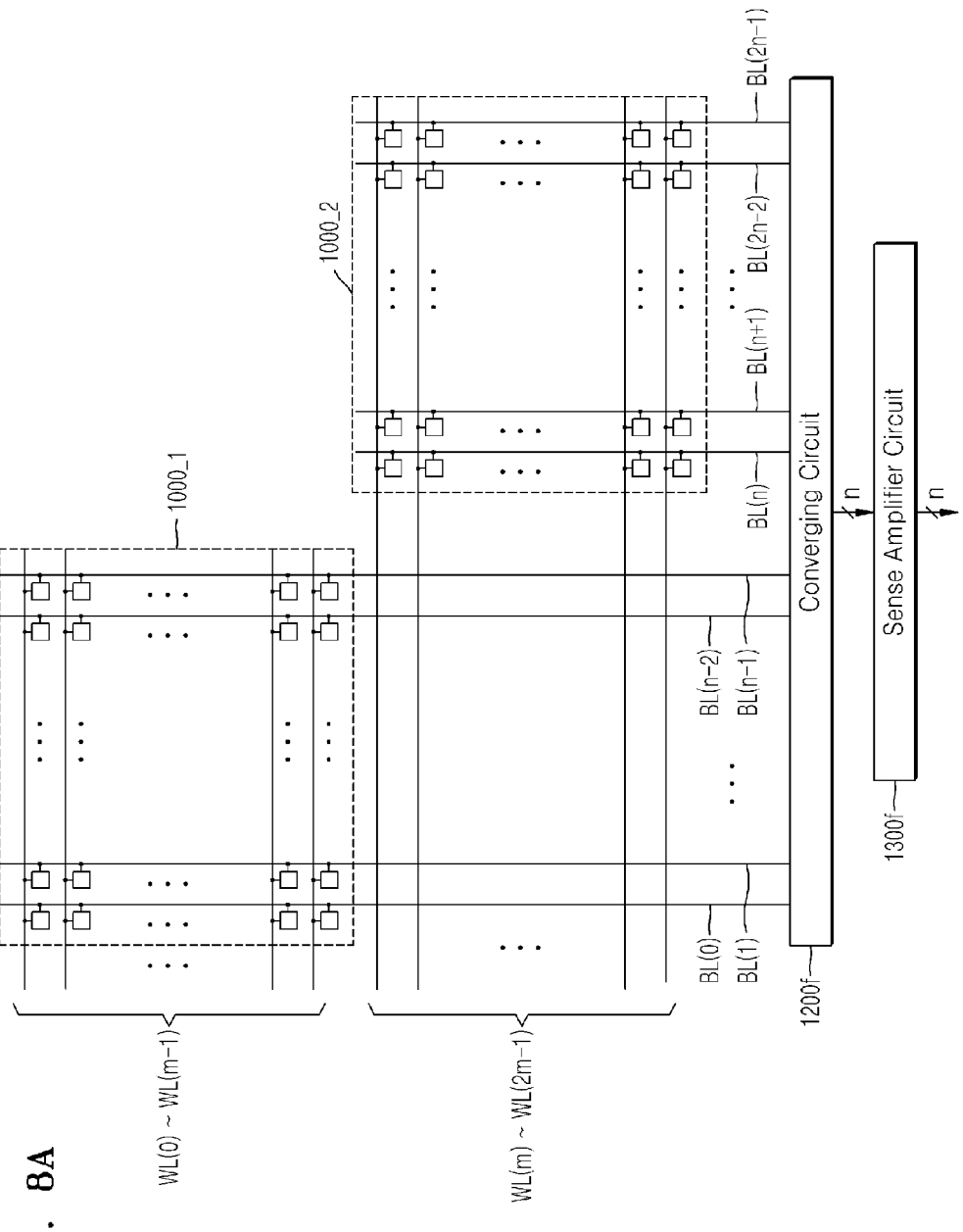
FIGS. 8A and 8B are views illustrating an OTP memory including a plurality of OTP cell arrays, according to exemplary embodiments.
Figure 8B:
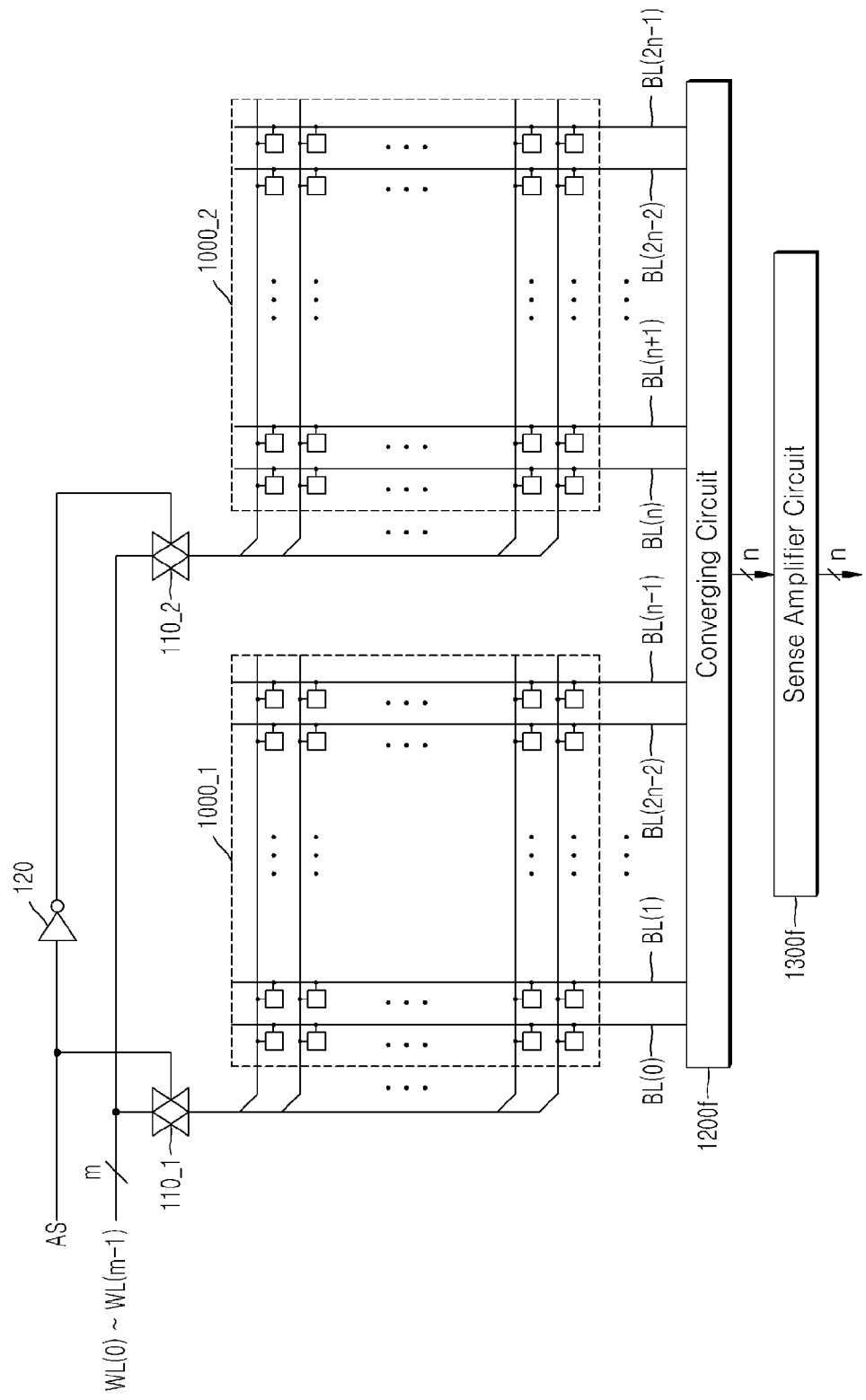

FIGS. 8A and 8B are views illustrating an OTP memory including a plurality of OTP cell arrays, according to exemplary embodiments. Each of the OTP memory shown in FIGS. 8A and 8B may include a first OTP cell array 1000_1, a second OTP cell array 1000_2, a converging circuit 1200*f*, and a sense amplifier circuit 1300*f*. The converging circuit 1200*f* may receive signals from the first OTP cell array 1000_1 and the second OTP cell array 1000_2 through 2n bit lines, and may transmit the signals of the n bit lines among the 2n bit lines to the sense amplifier circuit 1300*f*. The sense amplifier circuit 1300*f* may include n sense amplifiers and may receive signals from the converging circuit 1200*f* through n signal lines to detect and amplify the received signals. Although an OTP memory including two OTP cell arrays is shown in FIGS. 8A and 8B, embodiments of the present invention are applicable to an OTP memory including at least three OTP cell arrays.

FIG. 8A is a view illustrating an OTP memory including a plurality of OTP cell arrays, according to an exemplary embodiment. The OTP memory may include the first OTP cell array 1000_1, the second OTP cell array 1000_2, the converging circuit 1200*f*, and the sense amplifier circuit 1300*f*. Each of the first OTP cell array 1000_1 and the second OTP cell array 1000_2 may include m word lines and n bit lines.

As shown in FIG. 8A, the number of word lines WL(0) to WL(2m−1) of the OTP memory is a total of 2m, and the first OTP cell array 1000_1 and the second OTP cell array 1000_2 include different m word lines. For example, the first OTP cell array 1000_1 may include word lines WL(0) to WL(m−1), and the second OTP cell array 1000_2 may include word lines WL(m) to WL(2m−1). Additionally, the first OTP cell array 1000_1 and the second OTP cell array 1000_2 may include different n bit lines. For example, the first OTP cell array 1000_1 may include bit lines BL(0) to BL(n−1), and the second OTP cell array 1000_2 may include bit lines BL(n) to BL(2n−1).

The converging circuit 1200*f* may receive signals through the bit lines BL(0) to BL(2n−1) of the first OTP cell array 1000_1 and the second OTP cell array 1000_2, and may output n signals among signals received through the 2n bit lines. The sense amplifier circuit 1300*f* may detect and amplify an output signal of the converging circuit 1200*f* through n sense amplifiers.

In this embodiment, since the first OTP cell array 1000_1 and the second OTP cell array 1000_2 do not share the same word lines, the bit lines BL(0) to BL(n−1) of the first OTP cell array 1000_1 and the bit lines BL(n) to BL(2n−1) of the second OTP cell array 1000_2 may not output signals corresponding to bit data stored in antifuse cells simultaneously. The converging circuit 1200*f* may transmit signals of the bit lines BL(0) to BL(n−1) of the first OTP cell array 1000_1 or the bit lines BL(n) to BL(2n−1) of the second OTP cell array 1000_2 to the sense amplifier circuit 1300*f*.

FIG. 8B is a view illustrating an OTP memory including a plurality of OTP cell arrays, according to another exemplary embodiment. The OTP memory may include the first OTP cell array 1000_1, the second OTP cell array 1000_2, the converging circuit 1200*f*, and the sense amplifier circuit 1300*f*. As shown in FIG. 8B, the number of word lines WL(0) to WL(m−1) of the OTP memory is m. The word lines WL(0) to WL(m−1) are inputted as word lines of the first OTP cell array 1000_1 through a first pass gate 110_1, and the word lines WL(0) to WL(m−1) are inputted as word lines of the second OTP cell array 1000_2 through a second pass gate 110_2. The first pass gate 110_1 and the second pass gate 110_2 may connect or disconnect the word lines WL(0) to WL(m−1) of the OTP memory to or from the word lines of the first OTP cell array 1000_1 or the word lines of the second OTP cell array 1000_2.

An array select signal AS is a signal for selecting one of the first OTP cell array 1000_1 and the second OTP cell array 1000_2, and the OTP memory may output data stored in an OTP cell array selected according to the array select signal AS. As shown in FIG. 8B, the array select signal AS may control the first OTP cell array 110_1 and the second OTP cell array 110_2. The first pass gate 110_1 directly receives the array select signal AS, while the second pass gate 110_2 receives the inverted array select signal AS, so that in response to the array select signal AS, only one of the first pass gate 110_1 and the second pass gate 110_2 may connect the word lines WL(0) to WL(m−1) to the word lines of the OTP cell array.

The converging circuit 1200*f* of FIG. 8B may receive signals through 2n bit lines, and may transmit signals of the n bit lines among the 2n bit lines to the sense amplifier circuit 1300*f*. As mentioned above, in response to the array select signal AS, the bit lines BL(0) to BL(n−1) of the first OTP cell array 1000_1 and the bit lines BL(n) to BL(2n−1) of the second OTP cell array 1000_2 may not simultaneously output signals corresponding to bit data stored in antifuse cells. Accordingly, in relation to the embodiments shown in FIGS. 8A and 8B, unlike the converging circuits 1200*a* and 1200*b* of FIGS. 4A and 4B, the converging circuit 1200*f* may transmit signals of the n bit lines to the sense amplifier circuit 1300*f* regardless of a column address. The sense amplifier circuit 1300*f* may include n sense amplifiers 300 and may detect and amplify signals of the n bit lines through the sense amplifiers 300.

Figure 9:
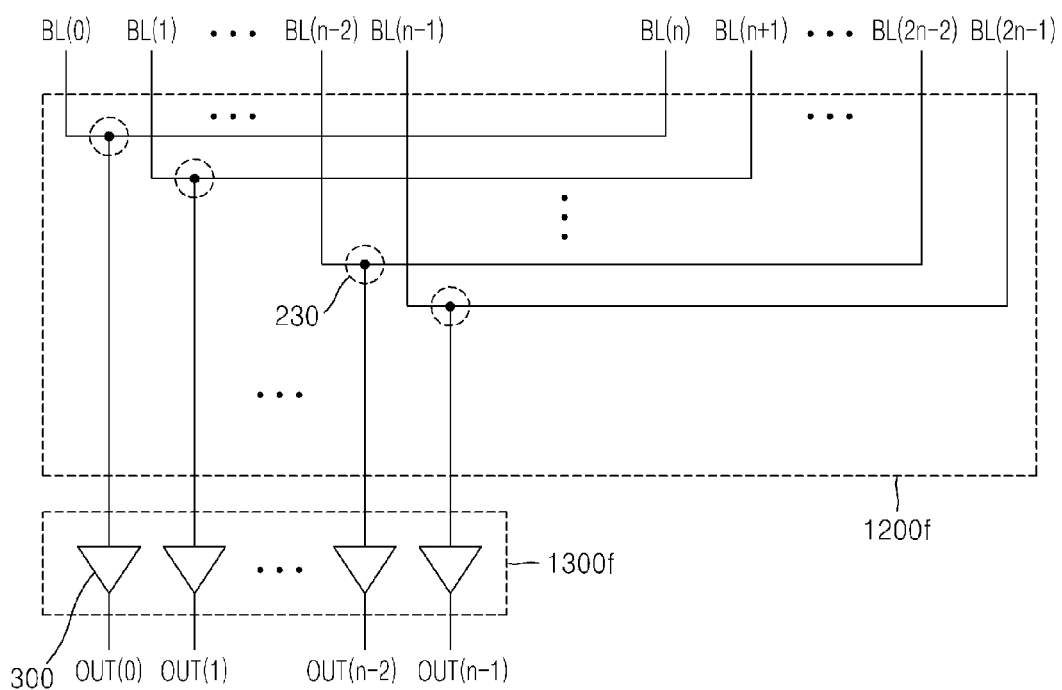
FIG. 9 is a view illustrating a converging circuit of FIGS. 8A and 8B according to an exemplary embodiment.

FIG. 9 is a view illustrating the converging circuit 1200*f* of FIGS. 8A and 8B according to an exemplary embodiment. As shown in FIGS. 8A and 8B, the converging circuit 1200*f* may transmit signals of the bit lines BL(0) to BL(n−1) of the first OTP cell array 1000_1 or the bit lines BL(n) to BL(2n−1) of the second OTP cell array 1000_2 to the sense amplifier circuit 1300*f*. As shown in FIG. 9, the converging circuit 1200*f* may include a combination node (e.g., a common node) connecting the bit lines BL(0) to BL(n−1) and the bit lines BL(n) to BL(2n−1). The bit line BL(0) may be connected to the bit line BL(n) by a combination node 230, and the bit line (n−1) may be connected to the bit line BL(2n−1) by another combination node 230. As mentioned above, since the bit lines BL(0) to BL(n−1) of the first OTP cell array 1000_1 or the bit lines BL(n) to BL(2n−1) of the second OTP cell array 1000_2 may not output signals simultaneously, the converging circuit 1200*f* may include the combination node 230 instead of a multiplexer.

Figure 10:
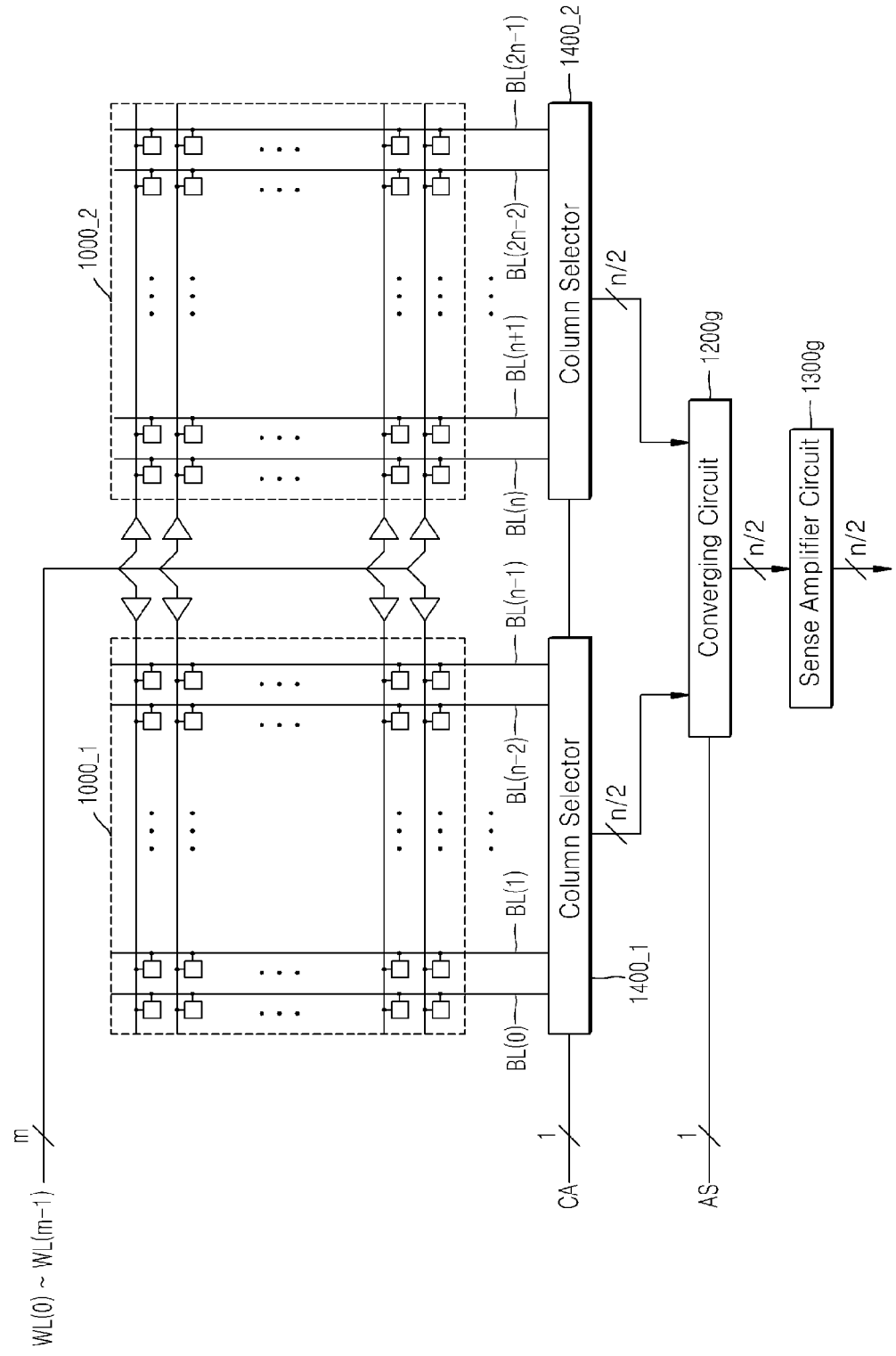
FIG. 10 is a view illustrating an OTP memory including a plurality of OTP cell arrays, according to another exemplary embodiment.

FIG. 10 is a view illustrating an OTP memory including a plurality of OTP cell arrays, according to another exemplary embodiment. The OTP memory may include the first OTP cell array 1000_1 and the second OTP cell array 1000_2. Additionally, the OTP memory may include a first column selector 1400_1, a second column selector 1400_2, a converging circuit 1200*g*, and a sense amplifier circuit 1300*g*. For example, the OTP memory may select a signal of the bit lines BL(0) to BL(2n−1) in response to a 1-bit column address CA and a 1-bit address select signal AS, and accordingly, output data of the OTP memory may have n/2 bits.

As shown in FIG. 10, the first OTP cell array 1000_1 and the second OTP cell array 1000_2 may share the word lines WL(0) to WL(m−1). Accordingly, when one word line is activated, the bit lines BL(0) to BL(n−1) of the first OTP cell array 1000_1 and the bit lines BL(n) to BL(2n−1) of the second OTP cell array 1000_2 may simultaneously output signals corresponding to data stored in antifuse cells. The first column selector 1400_1 and the second column selector 1400_2 may output signals of n/2 bit lines among the n bit lines in response to the column address CA. The first column selector 1400_1 may output signals of the n/2 bit lines among the bit lines BL(0) to BL(n−1) of the first OTP cell array 1000_1 in response to the column address CA, and the second column selector 1400_2 may output signals of the n/2 bit lines among the bit lines BL(n) to BL(2n−1) of the second OTP cell array 1000_2 in response to the column address CA.

The converging circuit 1200g may select and output an output signal of the first column selector 1400_1 or an output signal of the second column selector 1400_2 in response to the array select signal AS. The sense amplifier circuit 1300g may receive a bit line signal of an OTP cell array from the converging circuit 1200g through the n/2 signal lines, and then, may detect and amplify the received signal.

Figure 11:
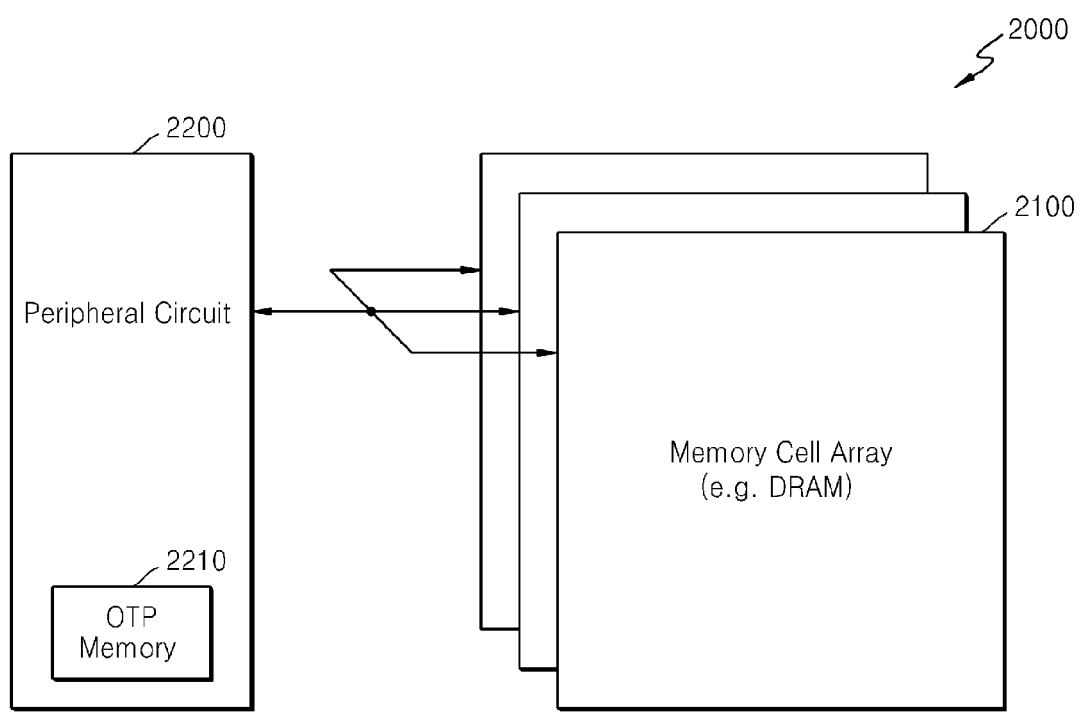
FIG. 11 is an exemplary block diagram illustrating a semiconductor memory device including an OTP memory, according to one embodiment.

FIG. 11 is an exemplary block diagram illustrating a semiconductor memory device 2000 including an OTP memory 2210, according to an embodiment. The semiconductor memory device 2000 may include at least one memory cell array 2100 and a peripheral circuit 2200. The memory cell array 2100 may store data transferred from the outside of the semiconductor memory device 2000. The memory cell array 2100 may include a plurality of normal memory cells such as volatile or nonvolatile cells, for example, DRAM, SRAM, or flash memory cells.

The peripheral circuit 2200 may control the memory cell array 2100. The peripheral circuit 2200 may include a row decoder, a column selector, a control logic, and an address register. Additionally, as shown in FIG. 11, the peripheral circuit 2200 may include the OTP memory 2210 according to the above-described embodiments. The control logic decodes a command received from the outside to generate a control signal, and the address register may temporarily store an address received from the outside and then, may transmit the stored address to another component. The row decoder and the column selector may generate a signal for controlling the memory cell array according to each row address and column address.

A certain normal cell in the memory cell array 2100 may store data, but may not accurately store the data due to various causes. A certain normal cell that did not store data accurately is called a defective cell that may occur while the memory device 2000 is manufactured or operates after being mounted on a system or a product.

If there is a defective cell, the semiconductor memory device 2000 may not accurately store data in the normal cell. Accordingly, in order to resolve the limitations due to defective cells, the semiconductor memory device 2000 stores the location information (e.g., an address) of a defective cell in an additional storage space, and by using this, stores data to be stored in the defective cell in another normal cell. Accordingly, in order to store information on defective cells, an OTP memory according to disclosed embodiments may be used. As mentioned above, since a defective cell may occur while the semiconductor memory device 2000 operates after being mounted on a system or a product, the peripheral circuit 2200 may update information on defective cells that the OTP memory 2210 stores.

The OTP memory 2210 may store information on defective cells and also may store other information for controlling the semiconductor memory device 2000. For example, the semiconductor memory device 2000 may have different characteristics while undergoing semiconductor manufacturing processes, and the OTP memory 2210 stores information on the different characteristics of the semiconductor memory devices 2000. The information may be used for controlling the memory cell array 2100.

If the data storage capacity of the semiconductor memory device 2000 is large, the size of the memory cell array 2100 may be increased. Since an OTP cell array in the OTP memory 2210 is relatively smaller than the memory cell array 2100 of the semiconductor memory device 2000, the percentage of space that a sense amplifier (which detects and amplifies a bit line signal of the OTP cell array) occupies in the OTP memory 2210 may be large. Accordingly, when the space that the sense amplifier occupies is reduced according to disclosed embodiments, the space that the OTP memory 2210 occupies in the semiconductor memory device 200 may be reduced, and the peripheral circuit 2200 may be easily arranged.

Figure 12:
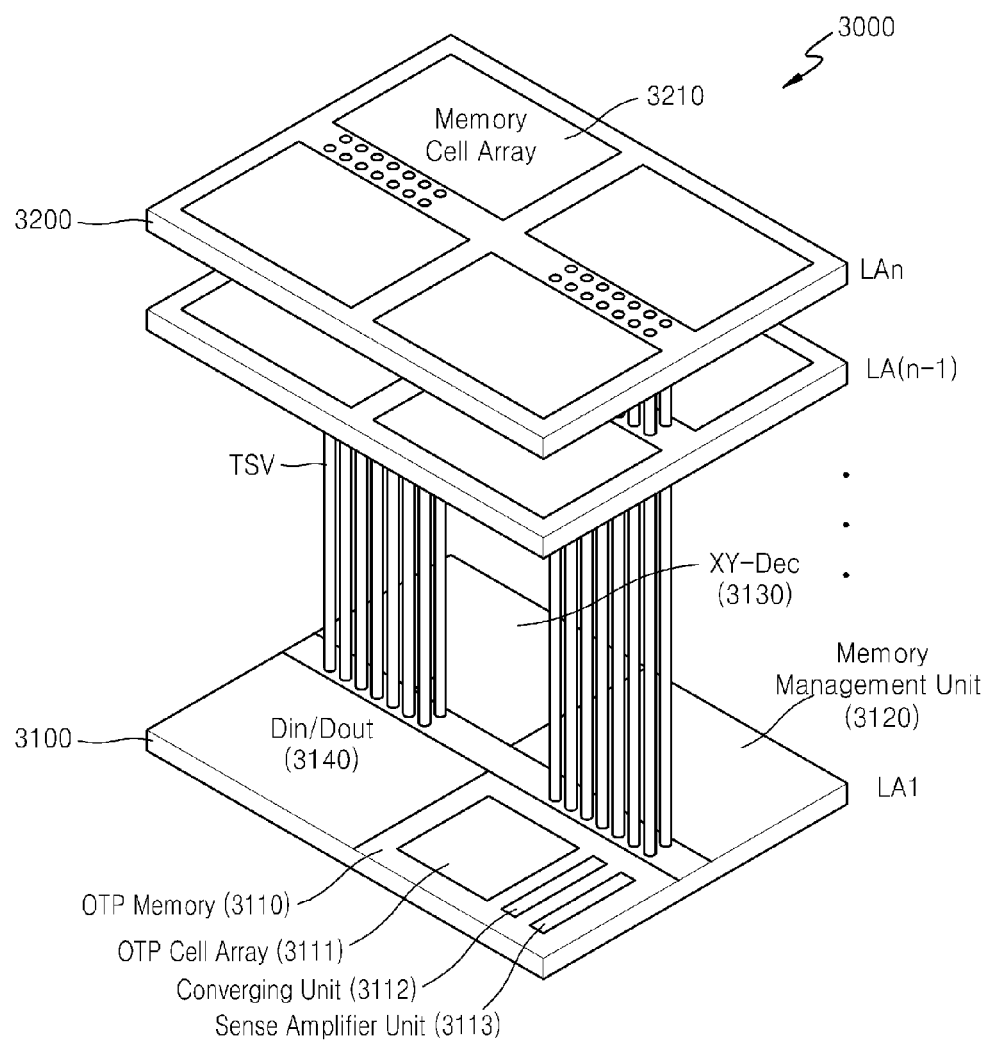
FIG. 12 is an exemplary structural diagram illustrating a semiconductor memory device according to one embodiment.

FIG. 12 is an exemplary structural diagram illustrating a semiconductor memory device according to an embodiment. As shown in FIG. 12, the semiconductor memory device 3000 may include a plurality of semiconductor layers LA1 to LAn. Each of the semiconductor layers LA1 to LAn may be a memory chip (for example, a DRAM memory chip). Some of the semiconductor layers LA1 to LAn may be master chips for interfacing with an external host and the remaining ones may be slave chips for storing data. Referring to FIG. 12, it will be assumed that the lowermost semiconductor layer LA1 is a master chip and the remaining semiconductor layers LA2 to LAn are slave chips.

The plurality of semiconductor layers LA1 to LAn may transmit/receive signals through through-substrate vias (e.g., through-silicon vias) or TSVs, and the semiconductor layer LA1 as the master chip may communicate with an external host (not shown) through a conductive means (not shown) formed externally. A configuration and operation of the semiconductor memory device 3000 will be described as follows with respect to a first semiconductor layer 3100 as a master chip and an nth semiconductor layer as a slave chip.

The first semiconductor layer 3100 may include various circuits for driving the memory cell array 3210 in slave chips. For example, the first semiconductor layer 3100 may include various circuits for driving a memory cell array 3210 in slave chips. For example, the first semiconductor layer 3100 may include a row-column selector (e.g., an X,Y-Dec) 3130 for driving word lines and bit lines of the memory cell array 3210, a data input/output circuit (e.g., a Din/Dout) 3140 for controlling input/output of data, a memory management circuit 3120 for processing a command received from the outside and managing a slave chip, and an OTP memory 3110.

As described with the above-mentioned embodiments, the memory management circuit 3120 may store information in the OTP memory 3110 for managing the memory cell array 3210 of a slave chip. For example, the OTP memory 3110 may include an OTP cell array 3111, a converging circuit 3112, and a sense amplifier circuit 3113. The OTP cell array 3111 stores data that the memory management circuit 3120 writes, and the converging circuit 3112 receives a signal through a bit line of the OTP cell array 3111 and transmits the received signal to the sense amplifier circuit 3113 according to the above-mentioned embodiments. The sense amplifier circuit 3113 detects and amplifies the signal from the converging circuit 3112.

Figure 13:
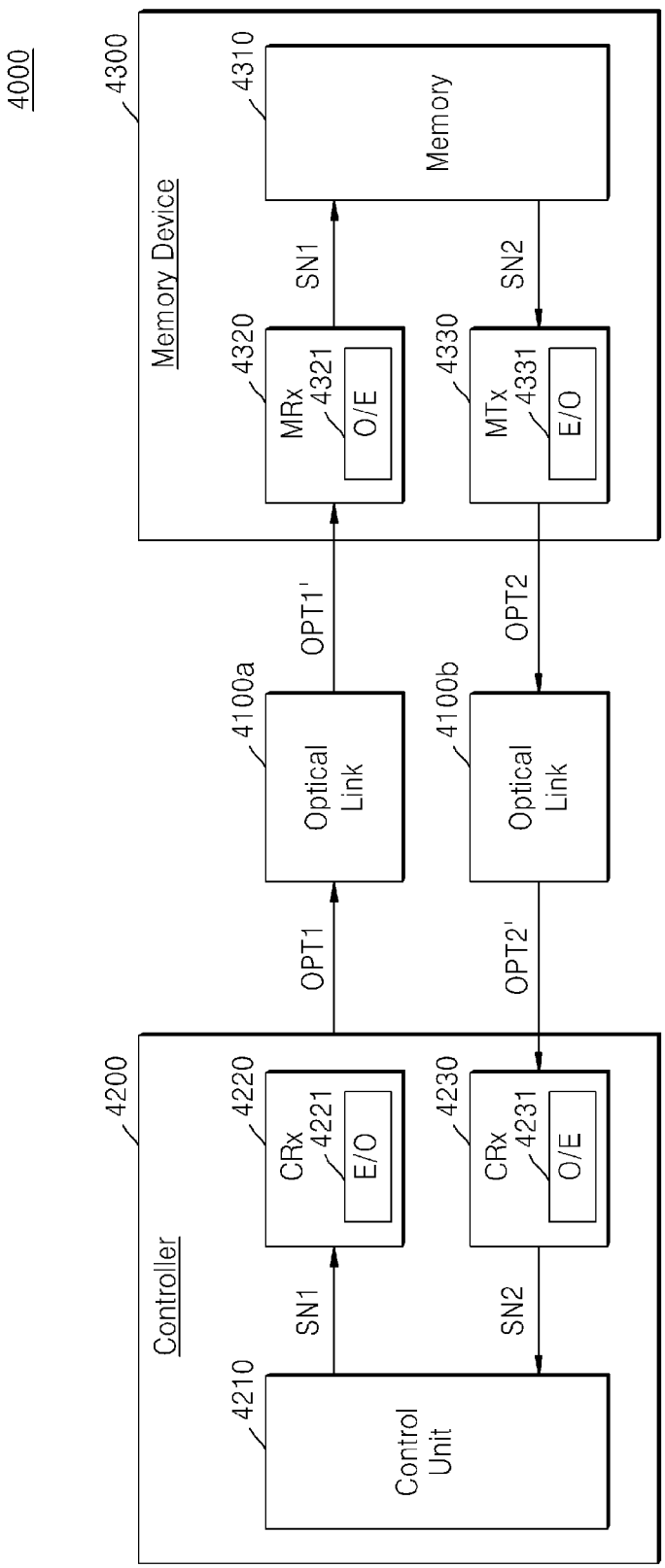
FIG. 13 is an exemplary diagram illustrating a memory system including an optical link, according to one embodiment.

FIG. 13 is an exemplary diagram illustrating a memory system 4000 including an optical link, according to an embodiment. Referring to FIG. 13, the memory system 4000 includes a controller 4200, a semiconductor memory device 4300 including an OTP memory of the disclosed embodiments, and optical links 4100a and 4100b. The controller 4200 includes a control unit 4210, a first transmitting unit 4220, and a first receiving unit 4230. The control unit 4210 transmits a first electrical signal SN1 to the first transmitting unit 4220. The first electrical signal SN1 may include command signals, clock signals, address signals, or write data, which are transmitted to the semiconductor memory device 4300.

The first transmitting unit 4220 may include a first optical modulator 4221. The first optical modulator 4221 converts the first electrical signal SN1 to a first optical transmission signal OTP1 and then transmits the first optical transmission signal OTP1 to the optical link 4100a. The first receiving unit 4230 may include a first optical demodulator 4231. The first optical demodulator 4231 converts a second optical reception signal OTP2' received from the optical link 4100b into a second electrical signal SN2, and then, transmits the second electrical signal SN2 to the control unit 4210.

The semiconductor memory device 4300 includes a second receiving unit 4320, a memory area 4310 including an OTP memory of the disclosed embodiments, and a second transmitting unit 4330. The second receiving unit 4320 may include a second optical demodulator 4321. The second optical demodulator 4321 converts a first optical reception signal OTP1' received from the optical link 4100a into a first electrical signal SN1', and then, transmits the first electrical signal SN1' into the memory area 4310.

The memory area 4310 writes data in response to the first electrical signal SN1' or transmits data read from the memory area 4310 to the second transmitting unit 4330 in response to the second electrical signal SN2'. The second electrical signal SN2' may include clock signals and read data, which are transmitted to the memory controller 4200. The second transmitting unit 4330 may include a second optical modulator 4331. The second optical modulator 4331 converts the second electrical signal SN2' to a second optical transmission signal OTP2 and then transmits the second optical transmission signal OTP2 to the optical link 4100b.

Figure 14:
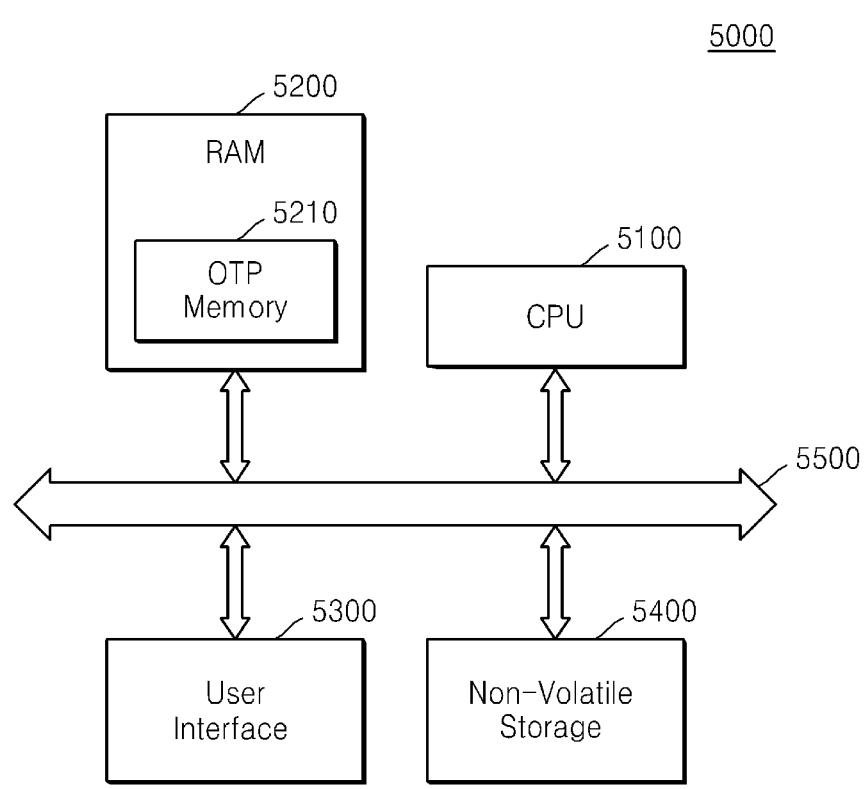
FIG. 14 is an exemplary block diagram illustrating a computing system equipped with a semiconductor memory device, according to one embodiment.

FIG. 14 is an exemplary block diagram illustrating a computing system 5000 equipped with a semiconductor memory device, according to an embodiment. In the computing system 5000, such as a mobile device or a desktop computer, a semiconductor memory device of the disclosed embodiments may be mounted as RAM 5200. The semiconductor memory device mounted as the RAM 5200 may include one OTP memory 5210 according to the above-mentioned embodiments. For example, a semiconductor memory device may be applied as the RAM 5200 in a memory module form. Additionally, the RAM 5200 of FIG. 14 may include a semiconductor memory device and a memory controller.

The computing system 5000 according to an embodiment includes a central processing unit (CPU) 5100, the RAM 5200, a user interface 5300, and a nonvolatile memory 5400, which are electrically connected to each other through a bus 5500. The nonvolatile memory 5400 may be used as a mass capacity device such as SSD or HDD.

In the computing system 5000, the RAM 5200 may include a memory area and the OTP memory 5210 for storing data. For example, the OTP memory 5210 may include an OTP cell array, a converging circuit, and a sense amplifier circuit. The OTP cell array of the OTP memory may store information for controlling the RAM 5200.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
  a first One Time Programmable (OTP) cell array and a second OTP cell array each including a plurality of bit lines connected to a plurality of OTP cells, each bit line extending in a first direction;
  a converging circuit connected to at least a first bit line of the first OTP cell array and at least a first bit line of the second OTP cell array, and the converging circuit configured to select at least one bit line between the first bit lines of the first and second OTP cell arrays; and
  a sense amplifier circuit configured to amplify at least one signal of the selected bit line,
  wherein the first OTP cell array includes a first word line connected to a plurality of OTP cells, the first word line extending in a second direction perpendicular to the first direction,
  wherein the second OTP cell array includes a second word line connected to a plurality of OTP cells, the second word line extending in the second direction, and
  wherein the first word line and the second word line are configured to be activated in response to the same row address.

2. The semiconductor memory device of claim 1, further comprising:
  a first column selector configured to connect the first bit line of the first OTP cell array to the converging circuit in response to a column address; and
  a second column selector configured to connect the first bit line of the second OTP cell array to the converging circuit in response to the column address,
  wherein the converging circuit is configured to output at least one signal of the selected bit line in response to an array select signal.

3. The semiconductor memory device of claim 1, wherein each of the OTP cells includes an antifuse circuit.

4. The semiconductor memory device of claim 1, further comprising:
  a normal memory cell array including a plurality of memory cells each having a volatile memory cell or a non-volatile memory cell,
  wherein the OTP cells are configured to store information managing the normal memory cell array.

5. The semiconductor memory device of claim 4, wherein the normal memory cell array is Dynamic Random Access Memory (DRAM) cell array.

6. The semiconductor memory device of claim 2, wherein the first column selector is disposed between the first OTP cell array and the converging circuit, and
  wherein the second column selector is disposed between the second OTP cell array and the converging circuit.

* * * * *